United States Patent
Ikeda et al.

(10) Patent No.: US 6,803,613 B2
(45) Date of Patent: Oct. 12, 2004

(54) SEMICONDUCTOR DEVICE AND MANUFACTURING METHOD OF THE SAME

(75) Inventors: Keiji Ikeda, Kawasaki (JP); Takashi Mimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/096,577

(22) Filed: Mar. 14, 2002

(65) Prior Publication Data

US 2003/0067021 A1 Apr. 10, 2003

(30) Foreign Application Priority Data

Oct. 10, 2001 (JP) .......................... 2001-312410

(51) Int. Cl.[7] .................. H01L 29/94; H01L 29/80; H01L 23/48
(52) U.S. Cl. .................. 257/288; 257/260; 257/748
(58) Field of Search ................. 257/260, 748, 257/288

(56) References Cited

U.S. PATENT DOCUMENTS 4,393,578 A * 7/1983 Cady et al. ................. 438/149

5,583,355 A * 12/1996 Bernhardt et al.

FOREIGN PATENT DOCUMENTS

JP  5-114708  5/1993

OTHER PUBLICATIONS

Patent Abstract of Japan, Publication No. 03280437 A, dated Dec. 11, 1991.

* cited by examiner

*Primary Examiner*—Michael Trinh
*Assistant Examiner*—Kiesha Rose
(74) *Attorney, Agent, or Firm*—Westerman, Hattori, Daniels & Adrian, LLP

(57) ABSTRACT

In a semiconductor heterojunction corresponding to the n-channel and p-channel, the present invention is to enable the selective carrier injection into each channel by employing a height difference of a Schottky barrier, $\phi B$, which is provided between a source/drain consisting of metal or semiconductor-intermetallic compound and a semiconductor film used for each channel of the semiconductor.

11 Claims, 8 Drawing Sheets

SEMICONDUCTOR DEVICE AND MANUFACTURING METHOD OF THE SAME

CROSS-REFERENCE TO RELATED APPLICATIONS

This application is based upon and claims priority of Japanese Patent Application No. 2001-312410, filed on Oct. 10, 2001, the contents being incorporated herein by reference.

BACKGROUND OF THE INVENTION

1. Field of the Invention

The present invention relates to a semiconductor device and its manufacturing method, more particularly to a field-effect transistor employing therein a different semiconductor junction.

2. Description of the Related Art

Taking the Si-CMOS structure, which is mainly well-known in the semiconductor integrated circuit as a typical example, the details will be explained.

The mobility differences between an electron and a hole due to the physical property of Si in itself affect performances of an n-channel transistor and a p-channel transistor, so that the improvements in the performance and the integration degree of CMOS semiconductor are disturbed.

In order to solve this problem, a device is invented wherein an n-channel film (Si film) and a p-channel film (SiGe film) are laminated by a heterojunction with a different semiconductor (SiGe) aiming at a performance improvement of the p-channel transistor (see, for example, Japanese Patent Laid-open No. Hei 3-280437).

In the MOSFET having the conventional semiconductor heterostructure taught in the document, carriers are injected via a pn-junction of a source and each channel. The carriers may be injected evenly to both channels.

The most holes injected flow at a channel formed on an interface of Si/SiGe, while a little thereof tends to flow at a channel formed on an interface of SiO2/Si. This phenomenon is called a parallel conduction.

This parallel conduction lowers the hole mobility of the p-MOSFET having the semiconductor heterostructure to thereby waste an increase merit of mobility by the Si/SiGe channel.

With a miniaturization of the MOSFET, which has the semiconductor heterostructure, difficult complexities of doping process may appear because of a creation of complicated doping profile preventing a short channel effect, and a variation of threshold voltage with a dispersion of impurities concentration.

SUMMARY OF THE INVENTION

The present invention is conceived reviewing the problems described above by providing a Schottky barrier-type source using metal and a drain for an n-channel and a p-channel laminated on the same substrate. This structure realizes that carriers can be injected selectively to each channel with restraining the short channel effect, which provides a new structure of the MOSFET having a semiconductor heterostructure. The thus-achieved selective carrier injection solves the parallel conduction issue. It is an object of the present invention to drastically upgrade the performance of the MOSFET, which has the semiconductor heterostructure.

The present invention reaches various aspects described below through a committed consideration.

A semiconductor device of the present invention includes a semiconductor substrate laminated with at least a first semiconductor film and a second semiconductor film to have a different semiconductor junction and having a channel portion therein; a gate insulation film provided on the semiconductor substrate; a gate electrode provided on the gate insulation film to be processed to a specific shape; and electrodes provided on both sides of the gate electrode and having metal or semiconductor-intermetallic compound therein.

Another aspect of the semiconductor device of the present invention includes the semiconductor substrate laminated with at least the first semiconductor film and the second semiconductor film to have the different semiconductor junction; the gate insulation film provided on the semiconductor substrate; the gate electrode provided on the gate insulation film to be processed to the specific shape; and a pair of impurity diffusion films of semiconductor-intermetallic compound provided on the surface of the semiconductor substrate in both sides of the gate electrode to feed metal reaching to the first and second semiconductor films 1, 2.

Still another aspect of the semiconductor device of the present invention includes the semiconductor substrate laminated with at least the first semiconductor film and the second semiconductor film to have the different semiconductor junction and having a channel portion therein; the gate insulation film provided on the channel portion; the gate electrode provided on the gate insulation film to be processed to a specific shape; and a pair of electrode films of the metal or the semiconductor-intermetallic compound joined on both sides of the channel portion.

Yet another aspect of the semiconductor device of the present invention is to operate with a selective carrier injection into each channel via a Schottky barrier generated in a semiconductor heterojunction of a different band gap with the metal or the semiconductor-intermetallic compound, and with an addition of modulation to the Schottky barrier through an electric field effect from the gate electrode.

A manufacturing method of the semiconductor device of the present invention includes the steps of providing on the substrate a different semiconductor lamination structure through the different semiconductor junction between the first semiconductor film and the second semiconductor film; providing the gate insulation film on the different semiconductor lamination structure; patterning the gate electrode in the specific shape on the gate insulation film; patterning a pair of metallic films in a specific shape on the different semiconductor lamination structure in both sides of the gate electrode; and providing a pair of impurity diffusion films of semiconductor-intermetallic compound by diffusing metal of the metallic films reaching to the first and second semiconductor films of the different semiconductor lamination structure.

Another aspect of the manufacturing method of the semiconductor device of the present invention includes the steps of providing on the substrate the different semiconductor lamination structure through the different semiconductor junction between the first semiconductor film and the second semiconductor film; providing the gate insulation film on the different semiconductor lamination structure; patterning the gate electrode in the specific shape on the gate insulation film; providing the channel portion by removing the different semiconductor lamination structure except for a neighborhood site under the gate electrode; and patterning the pair of electrode films of the metal or the semiconductor-intermetallic compound as joining with both sides of the channel portion.

DETAILED DESCRIPTION OF THE PREFERRED EMBODIMENTS

Figure 1:
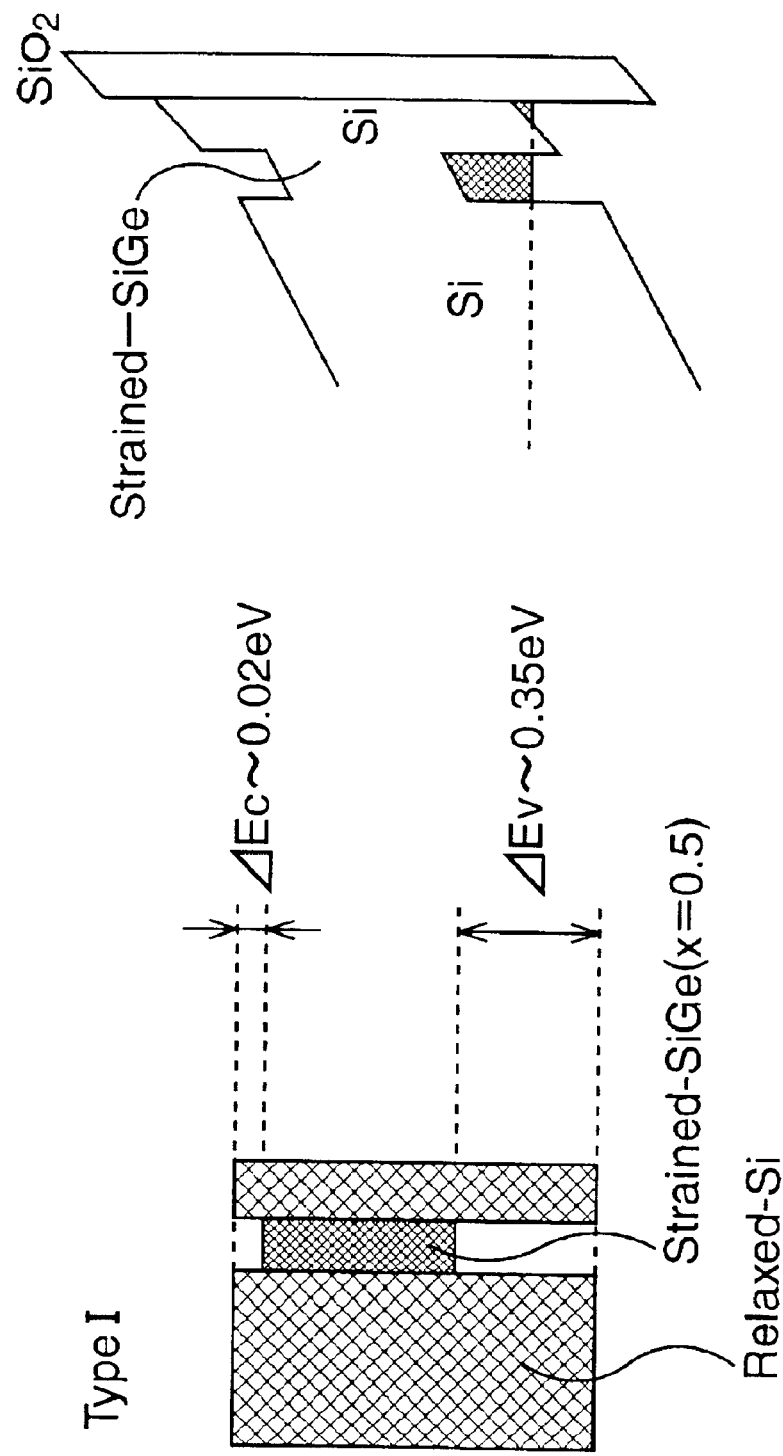
FIG. 1 is a band diagram of a Si/SiGe heterostructure in an embodiment of the present invention.

A different semiconductor junction involves discontinuities, which are referred as "band offset", of a conductor and a valence band at a junction interface due to its band gap. FIG. 1 shows a band diagram of a Si/SiGe heterostructure. Preferable embodiments based on the principal of this invention will be explained, taking an operation of a p-channel in the Si, SiGe heterostructure as an instance.

First Embodiment

The band structure may change by a Ge concentration of the SiGe and a distortion to each film in the Si, SiGe heterostructure. When carriers are injected in a structure, which is called as "Type I" in FIG. 1, holes are accumulated at the SiGe film. The band structure is however modulated by a field-effect from a gate, so that a p-channel is also provided at an Si/SiO2 interface. This channel is the reason for the parallel conduction issue.

Figure 2:
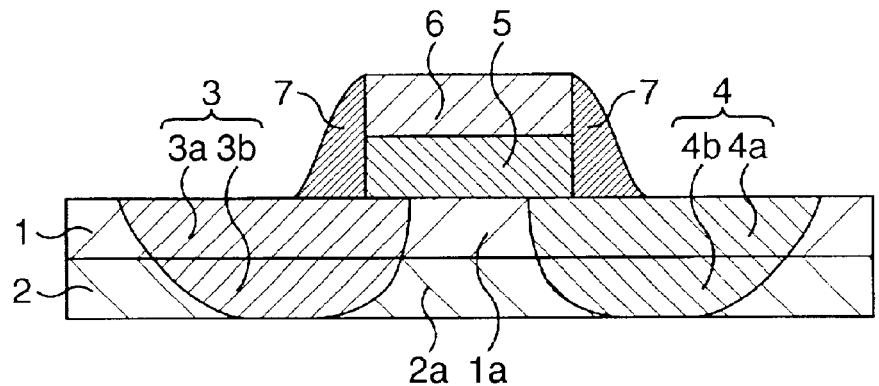
FIG. 2 is a schematic sectional view showing a semiconductor device of a first embodiment of the present invention.

FIG. 2 is a schematic sectional view showing a semiconductor device of the first embodiment of the present invention.

The semiconductor device is composed of a first semiconductor film 1 and a second semiconductor film 2. The first semiconductor film 1 and the second semiconductor film 2 are laminated to have a different semiconductor junction structure. On the upper film of the first semiconductor film 1, there is patterned a specified gate electrode 6 via a gate insulation film 5. On their both sides, sidewalls (side wall protect layers) 7 are provided.

Under the sidewalls 7, a source 3 and a drain 4 as a pair of diffusion films of semiconductor-intermetallic compound are provided in both sides of the sidewalls 7 by feeding metal reaching to the first and second semiconductor films 1, 2. In the drawings, a drain formed in the first semiconductor film 1 is designated with "3a", a source is designated with "4a", a drain formed in the second semiconductor film 2 is designated with "3b", and a source is designated with "4b".

Figure 3:
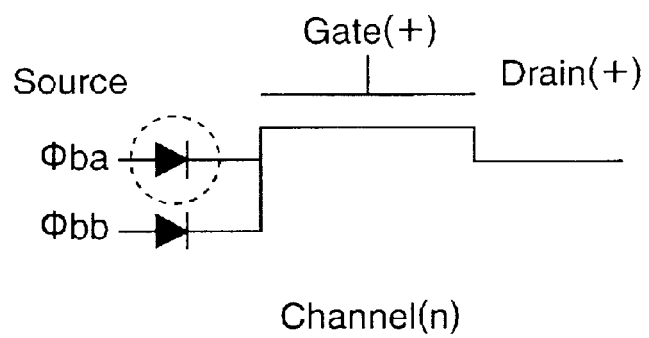
FIG. 3 is an equivalent circuit under an n-channel operation showing the embodiment of the present invention.

In the present embodiment, showing an example of using a channel portion 1a in the first semiconductor film 1 as an n-channel and a channel portion 2a in the second semiconductor film 2 as a p-channel, the details will be explained. When this device operates as the n-channel, a positive voltage is impressed on the gate electrode 6 and the drain 4 (drain 4a and drain 4b), respectively. An equivalent circuit under the n-channel operation is shown in FIG. 3. Impressing the gate voltage diminishes a potential energy barrier between the source 3 (source 3a and source 3b) and the channel.

This results in injecting electrons tunnellingly and thermally into the channel through a potential barrier provided with a Schottky barrier. Note that heights of the barriers against the electrons at a Schottky junction provided between the source 3a and the first semiconductor film 1, and a Schottky junction provided between the source 3b and the second semiconductor film 2 are $\phi$ ba and $\phi$ bb, respectively. Setting $\phi$ ba<$\phi$ bb allows the electrons to be injected preferentially into the channel portion 1a in the first semiconductor film 1. This results in providing the n-channel, through which the electrons move, preferentially on the interfaces of the gate insulation film 5 and the channel portion 1a in the first semiconductor film 1.

Figure 4:
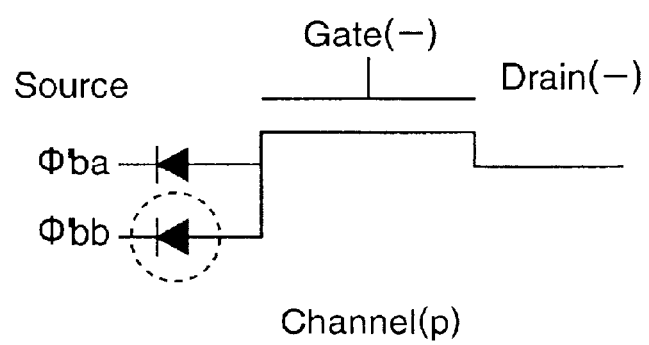
FIG. 4 is an equivalent circuit under a p-channel operation showing the embodiment of the present invention.

When this device operates as the p-channel, a negative voltage is impressed on the gate electrode 6 and the drain 4 (drain 4a and drain 4b), respectively. An equivalent circuit under the p-channel operation is shown in FIG. 4. Impressing the gate voltage on the gate electrode 6 and the drain 4 diminishes the potential energy barrier between the source 3 (source 3a and source 3b) and the channel.

This results in injecting holes tunnellingly and thermally into the channel through the potential barrier that is provided with the Schottky barrier. Note that heights of the barriers against the holes at the Schottky junction provided between the source 3a and the first semiconductor film 1 and the Schottky junction provided between the source 3b and the second semiconductor film 2 are $\phi'$ ba and $\phi'$ bb, respectively. Setting $\phi'$ ab>$\phi'$ bb allows the holes to be injected only into the channel portion 2a in the second semiconductor film 2. This results in proving the p-channel, through which the holes move, only on the interfaces of the channel portion 1a in the semiconductor film 1 and the channel portion 2a in the semiconductor film 2.

Such a selective carrier injection described above is made available in this device, wherein the electrons are injected into the channel portion 1a in the semiconductor film 1 of the n-channel, while the holes into the channel portion 2a in the semiconductor film 2 of the p-channel. This solves a parallel conduction issue and then realizes a drastic performance upgrade.

There is realized a FET operation by controlling with a gate field a thickness of a depletion layer region provided in the Schottky barrier that is generated through a junction between metal or semiconductor-intermetallic compound and a semiconductor.

A carrier is injected into a semiconductor film used for a channel by tunneling through the Schottky barrier, to thereby adjust the height of the Schottky barrier which is generated through the junction between the metal or the semiconductor-intermetallic compound used for the source 3 and the semiconductor film, as well as to provide a semiconductor device without doping in principle. Skipping a doping process can also dissolve a problem of dopant solid solubility in the semiconductor film, a problem of a threshold voltage variation caused by dispersion of impurities concentration, and an impact of impurities scattering.

The metal and the semiconductor-intermetallic compound can realize a higher carrier density and lower resistance by one or more figure than the semiconductor film doped to about a solid solubility limit. This enables to lower a contact resistance between the source/drain and the electrode, and the wire.

When one kind of metal can realize the Schottky barrier as the metal or the semiconductor-intermetallic compound for the source/drain, a manufacturing process can be drastically simplified.

Second Embodiment

Figure 5:
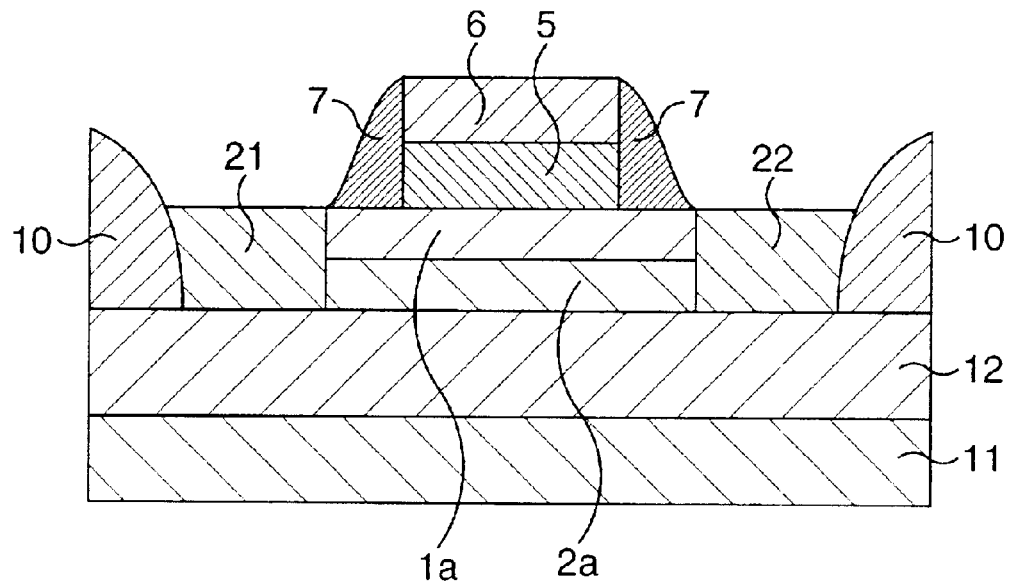
FIG. 5 is a schematic sectional view showing the semiconductor device of a second embodiment of the present invention.

FIG. 5 is a schematic sectional view showing a semiconductor device of a second embodiment of the present invention.

This semiconductor device has the so-called SOI (Semiconductor On Insulator) structure, in which the semiconductor heterojunction is structured on an insulation substrate or a semi-insulation semiconductor substrate. A different semiconductor junction structure of a first semiconductor film 1 and a second semiconductor film 2 is patterned on a silicon substance 11 via an insulation film 12 to provide a channel portion. On the upper film of the first semiconductor film 1, there is patterned a specified gate electrode 6 via a gate insulation film 5. On their both sides, sidewalls 7 are provided.

A structure 10 of an element isolation with a LOCOS method or the like is provided on the insulation film 12. A gap between the element isolation structure 10 and the different semiconductor junction structure is filled with metal or semiconductor-intermetallic compound. There are provided a source 21 and a drain 22, which are a pair of electrode films joined on both sides of the different semiconductor junction structure.

In this device as with the first embodiment, a selective carrier injection is achieved, wherein the electrons are injected into the channel portion 1a in the semiconductor film 1 of the n-channel, while the holes into the channel portion 2a in the semiconductor film 2 of the p-channel. This solves a parallel conduction issue and realizes a drastic performance upgrade.

It is also realized by employing the SOI structure to reduce a leak current against the substrate and restrain a short channel effect.

Modification Example

Hereinafter described is a modification example of the present embodiment.

Figure 6:
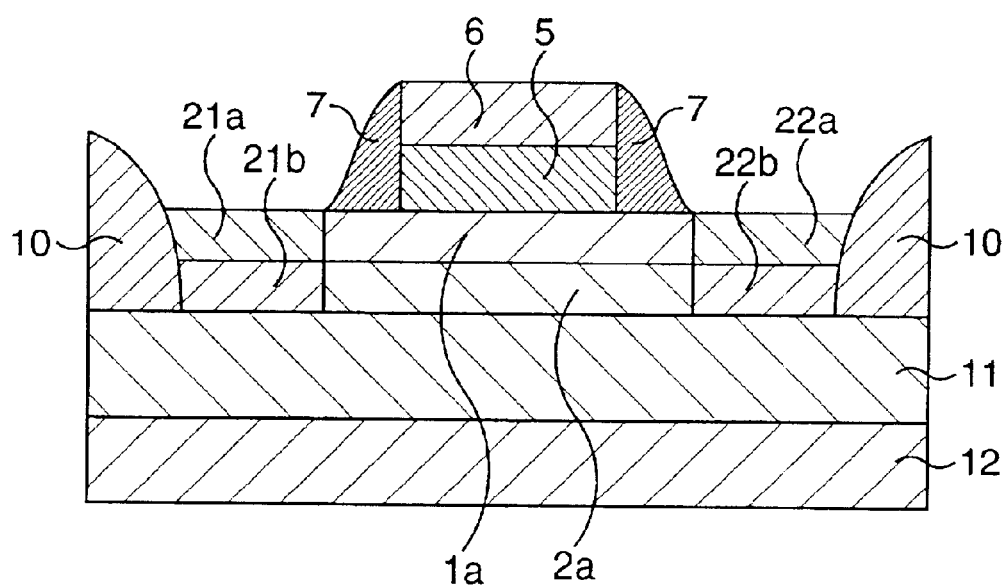
FIG. 6 is a schematic sectional view showing a modification example of the semiconductor device of the second embodiment of the present invention.

FIG. 6 is a schematic sectional view showing a semiconductor device of the modification of the second embodiment.

This semiconductor device has generally the same structure as that of the second embodiment. It, however, differs in a point where the source 21 and the drain 22 are provided with two layers of different metal or semiconductor-intermetallic compound so as to conform to the different semiconductor junction structure. In this case, the source 21 is composed of sources 21a, 21b, and the drain 22 is composed of drains 22a, 22b.

Manufacturing Method of a Semiconductor Device in the First Embodiment

Hereinafter described is a manufacturing method of a semiconductor device employing therein a Si/SiGe heterostructure in the first embodiment.

FIGS. 7A to 7E and FIGS. 8A to 8E are schematic sectional views showing a process flow of the manufacturing method of the semiconductor device in the first embodiment shown in FIG. 2.

Figure 7A:
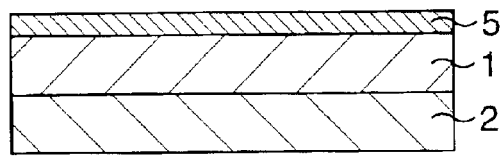
FIGS. 7A to 7E are schematic sectional views showing a process flow of a manufacturing method of the first embodiment shown in FIG. 2, FIGS. 8A to 8E are schematic sectional views following FIG. 7E, showing a process flow of the manufacturing method of the first embodiment.

First, as shown in FIG. 7A, the first semiconductor film (Si film) 1 and the second semiconductor film (SiGe film) 2 are accumulated to provide a different semiconductor junction structure (Si/SiGe structure). They are employed to provide a gate insulation film 5 consisting of SiO2 on the surface of the first semiconductor film 1 with a thermal oxidation method or a CVD method.

Figure 7B:
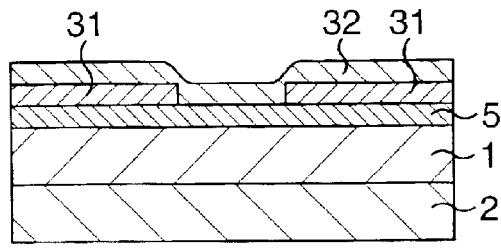

Next, as shown in FIG. 7B, a resist pattern 31 is provided in a shape to have an opening that only provides a gate electrode site on the gate insulation film 5. A gate metallic material 32 is deposited on the resist pattern 31 with a vacuum deposition method, a sputter method, the CVD method, or the like to fill in the opening.

Figure 7C:
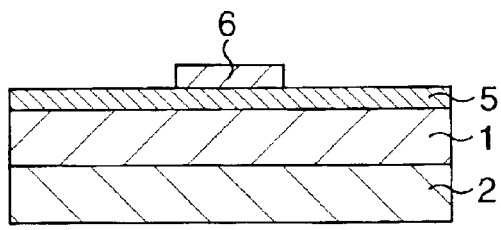

Next, as shown in FIG. 7C, the gate metallic material 32 on the resist pattern 31 is removed concurrently with the resist pattern 31 exfoliatively removed with the so-called lift off method. The gate metallic material 32 is left by following the opening shape, which provides a gate electrode 6.

Figure 7D:
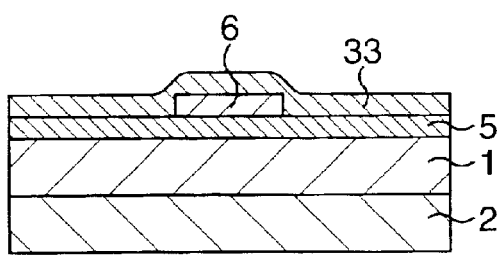

Next, as shown in FIG. 7D, a silicon oxide layer (TEOS, SiO2) 33 is fully deposited with the vacuum deposition method, the sputter method, the CVD method, or the like to cover the gate electrode 6.

Figure 7E:
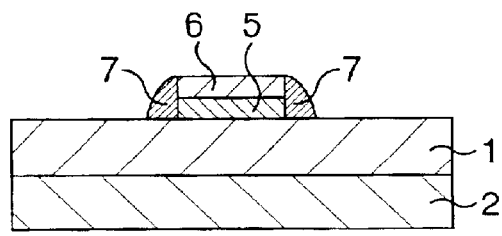

Next, as shown in FIG. 7E, the overall silicon oxide layer 33 is applied with an anisotropic etching (etch back) such as a RIE. The silicon oxide layer 33 is left only both sides of the gate electrode 6 to provide sidewalls 7.

Figure 8A:
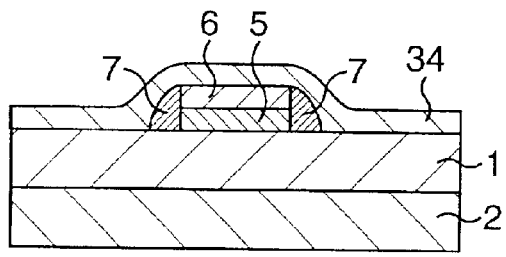

Next, as shown in FIG. 8A, a metallic film 34, for example, consisting of Er, Pt for providing a source/drain is deposited with the vacuum deposition method, the sputter method, the CVD method, or the like to cover the gate electrode 6 and the sidewalls 7.

Figure 8B:
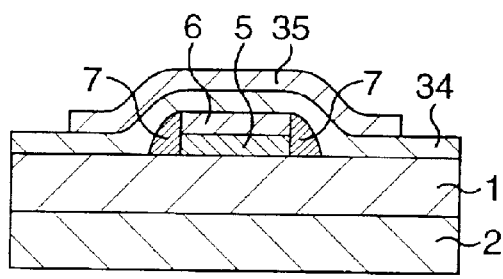

Next, as shown in FIG. 8B, a resist pattern 35 is applied to provide the source/drain.

Figure 8C:
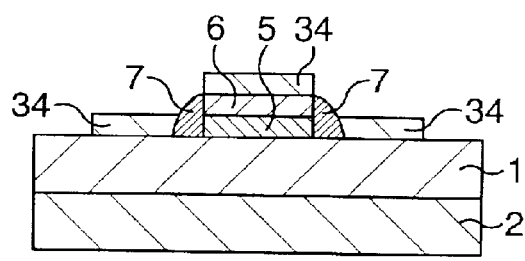

Next, as shown in FIG. 8C, taking the resist pattern 35 as a mask, the metallic film 34 is patterned with a photolithography and the subsequent anisotropic etching such as RIE to leave the metallic film 34 on sites for providing the source/drain. As shown in the drawing, a siliside may be provided as well by leaving the metallic film 34 on the gate electrode 6. Thereafter, the resist pattern 35 is removed with an incineration or the like which employs O2 plasma.

Figure 8D:
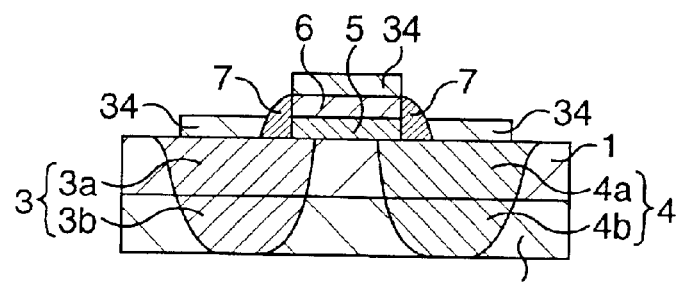

Next, as shown in FIG. 8D, with a heat treatment in an inert atmosphere such as Ar, He, and N2, the metallic film 34 reacts with Si of the first semiconductor film 1 and SiGe of the second semiconductor film 2 so as to provide a source 3 and a drain 4. Note that the source 3 is composed of sources 3a, 3b, and the drain 4 is composed of drains 4a, 4b. In the first semiconductor film 1, the source 3a and the drain 4a consisting of the siliside are provided, while in the second semiconductor film 2, the source 3b and the drain 4b consisting of SiGe and metal compound are provided.

Figure 8E:
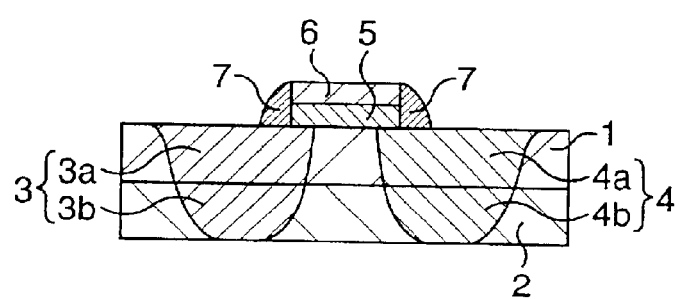

Next, as shown in FIG. 8E, non-reacted metal with the heat treatment is removed through an etching process (wet-etching).

Thereafter, through processes such as to provide interlayer insulation films, contact holes, and various wire films, the semiconductor device of the first embodiment is completed.

Manufacturing Method of a Semiconductor Device in the Second Embodiment

Hereinafter described is a manufacturing method of a semiconductor device employing therein a Si/SiGe heterostructure in the second embodiment.

FIGS. 9A to 9E and FIGS. 10A to 10E are schematic sectional views showing a process flow of the manufacturing method of the semiconductor device in the second embodiment shown in FIG. 5.

Figure 9A:
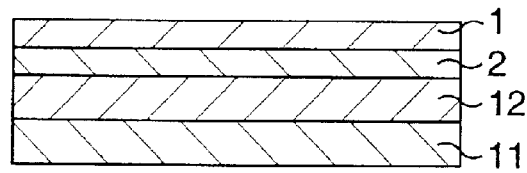
FIGS. 9A to 9E are schematic sectional views showing a process flow of a manufacturing method of the second embodiment shown in FIG. 5, FIGS. 10A to 10E are schematic sectional views following FIG. 9, showing a process flow of the manufacturing method of the second embodiment.

First, as shown in FIG. 9A, an SOI substrate is provided on a silicon substance 11 via an insulation film 12. A different semiconductor junction structure of a first semiconductor film (Si film) 1 and a second semiconductor film (SiGe film) 2 is provided thereon with the CVD method, a MBE method, or the like.

Figure 9B:
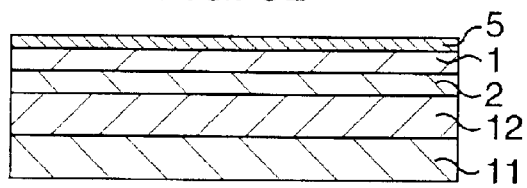

Next, as shown in FIG. 9B, a gate insulation film 5 consisting of SiO2 is provided on the surface of the first semiconductor film 1 with a thermal oxidation method or the CVD method.

Figure 9C:
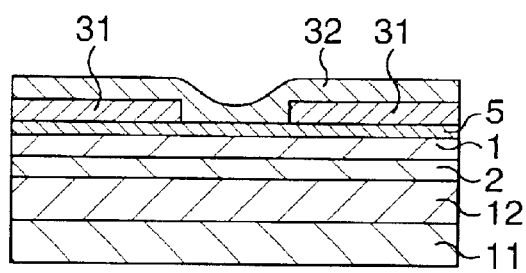

Next, as shown in FIG. 9C, a resist pattern 31 is provided in a shape to have an opening that only provides a gate electrode site on the gate insulation film 5. A gate metallic material 32 is deposited on the resist pattern 31 with a vacuum deposition method, a sputter method, the CVD method, or the like to fill in the opening.

Figure 9D:
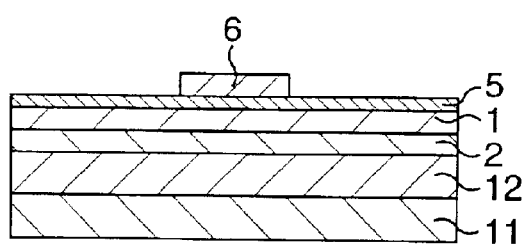

Next, as shown in FIG. 9D, the gate metallic material 32 on the resist pattern 31 is removed concurrently with the resist pattern 31 exfoliatively removed with the so-called lift off method. The gate metallic material 32 is left by following the opening shape, which provides a gate electrode 6.

Figure 9E:
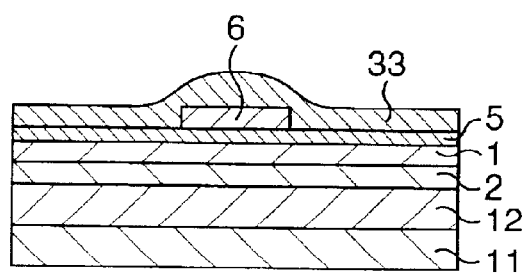

Next, as shown in FIG. 9E, a silicon oxide layer (TEOS, SiO2) 33 is fully deposited with the CVD method to cover the gate electrode 6.

Figure 10A:
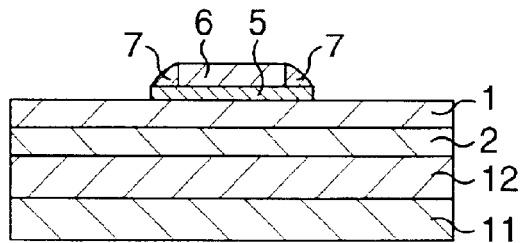

Next, as shown in FIG. 10A, the overall silicon oxide layer 33 is applied with an anisotropic etching (etch back) such as a RIE. The silicon oxide layer 33 is left only both sides of the gate electrode 6 to provide sidewalls 7.

Figure 10B:
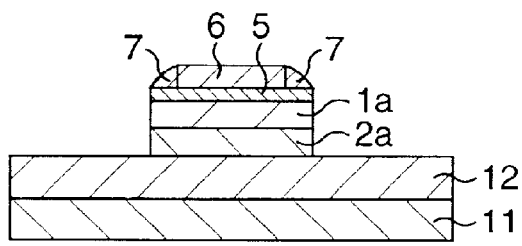

Next, as shown in FIG. 10B, taking the gate electrode 6 and the sidewalls 7 as a mask, a different semiconductor lamination structure composed of the first semiconductor film 1 and the second semiconductor film 2 is applied with the anisotropic etching such as the RIE. The different semiconductor lamination structure is removed except for a neighborhood site under the gate electrode 6 to provide channel portions 1a, 2a.

Figure 10C:
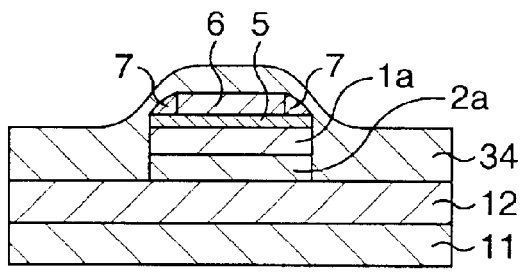

Next, as shown in FIG. 10C, a metallic film 34, for example, consisting of Er, Pt for providing a source/drain is deposited with the vacuum deposition method, the sputter method, the CVD method, or the like to cover all surfaces including the upper part and both sides of the channels 1a, 2a.

Figure 10D:
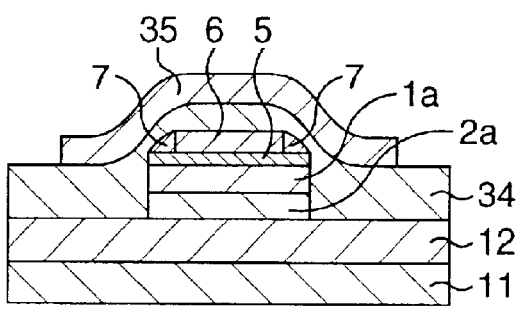

Next, as shown in FIG. 10D, a resist pattern 35 is applied to provide the source/drain.

Figure 10E:
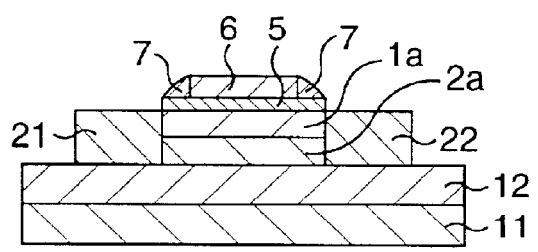

Next, as shown in FIG. 10E, taking the resist pattern 35 as a mask, the metallic film 34 is patterned with a photolithography and the subsequent anisotropic etching such as RIE to leave the metallic film 34 on sites for providing the source/drain, which provides a source 21 and a drain 22.

Thereafter, through processes such as to provide interlayer insulation films, contact holes, and various wire films, the semiconductor device of the second embodiment is completed.

Manufacturing Method of the Modification Example of a Semiconductor Device in the Second Embodiment Hereinafter described is a manufacturing method of the modification of a semiconductor device employing therein a Si/SiGe heterostructure in the second embodiment.

FIG. 11 is a schematic sectional view showing a process flow of the manufacturing method of the semiconductor device in this modification example.

First, this example goes through each process from FIGS. 9A to 9E and FIGS. 10A to 10B.

Figure 11A:
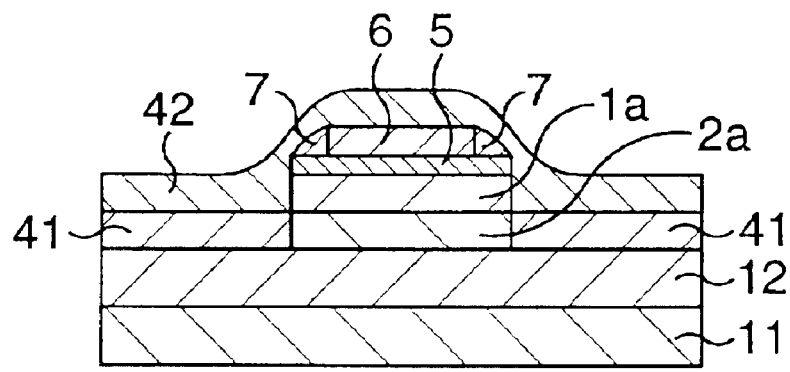
FIGS. 11A to 11C are schematic sectional views following FIG. 10, showing a process flow of a manufacturing method of the modification example of the second embodiment.

Next, as shown in FIG. 11A, metallic films 41, 42, for example, consisting of Pt, Er, respectively for providing a source/drain are laminatingly deposited with the vacuum deposition method, the sputter method, the CVD method, or the like to cover all surfaces including the upper part and both sides of the channels 1a, 2a.

Figure 11B:
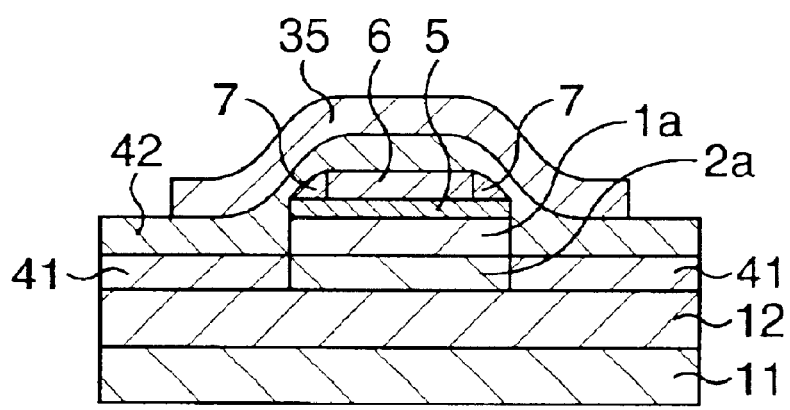

Next, as shown in FIG. 11B, a resist pattern 35 is applied to provide the source/drain.

Figure 11C:
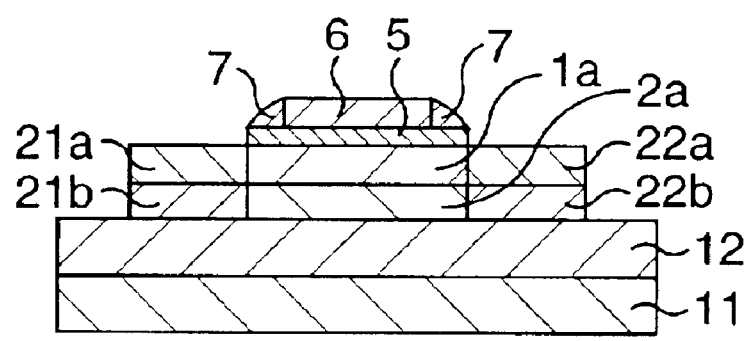

Next, as shown in FIG. 11C, taking the resist pattern 35 as a mask, the metallic films 41, 42 are patterned with a photolithography and the subsequent anisotropic etching such as RIE to leave the metallic films 41, 42 on sites for providing the source/drain, which provides two layers of source 21 (sources 21a, 21b) and drain 22 (drains 22a, 22b).

Thereafter, through processes such as to provide interlayer insulation films, contact holes, and various wire films, the semiconductor device of the second embodiment is completed.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

A Schottky barrier is provided through a Schottky junction between at least two layers of semiconductor films composed of different semiconductors and a diffusion film (source/drain) consisting of metal or semiconductor-intermetallic compound. A difference thereof enables a selective carrier injection on each channel, to thereby dissolve a problem of performance degradation caused by a parallel conduction.

An extremely shallow junction is made available at a low contact resistance by providing a semiconductor-intermetallic compound through a reaction on interfaces of a semiconductor/metal. Thereby, a short channel effect can be restrained. When OFF, current injection efficiency to a channel significantly decreases due to the Schottky barrier, which does not change depending on a drain field, so that a high ON/OFF ratio can be realized.

Synergetic effects of lowering the contact resistance, increasing a carrier mobility by enabling to select a channel material suitable for each carrier, and the like, also realize a high-speed operation and low consumption.

A doping process can be skipped as well, which enables to significantly simplify a process.

Structuring the semiconductor device on an insulation substrate or a semi-insulation semiconductor substrate can reduce a leak current against a substrate as well.

What is claimed is:

1. A semiconductor device, comprising:
  a semiconductor substrate laminated with at least a first semiconductor film and a second semiconductor film to have a semiconductor hetero-junction;

a gate insulation film provided on the semiconductor substrate;

a gate electrode provided on the gate insulation film to be processed to a specific shape; and a pair of films including semiconductor-intermetallic compounds in both sides of the gate electrode reaching to the first and second semiconductor films, wherein said pair of films and said first and second semiconductor films have a Schottky junction.

2. The semiconductor device according to claim 1, wherein the first semiconductor film and the second semiconductor film are opposite to each other in a conductivity type.

3. A semiconductor device, comprising:

a semiconductor substrate laminated with at least a first semiconductor film and a second semiconductor film to have a semiconductor hetero-junction and comprising a channel portion therein;

a gate insulation film provided on the channel portion;

a gate electrode provided on the gate insulation film to be processed to a specific shape; and a pair of electrode films including metal or semiconductor-intermetallic compound joined on both sides of the channel portion, wherein said pair of electrode films and said channel portion have a Schottky junction.

4. The semiconductor device according to claim 3, wherein the first semiconductor film and the second semiconductor film are opposite to each other in a conductivity type.

5. The semiconductor device according to claim 3, wherein said semiconductor substrate comprises the channel portion provided on an insulation film or a semi-insulation semiconductor film.

6. The semiconductor device according to claim 3, wherein each of said pair of electrode films has a multitiered structure with different materials.

7. A semiconductor device, comprising:

a semiconductor substrate comprising a channel portion, laminated with at least a first semiconductor film and a second semiconductor film to have a semiconductor hetero-junction;

a gate insulation film provided on the semiconductor substrate, a gate electrode provided on the gate insulation film to be processed to a specific shape; and a pair of electrodes provided in both sides of the gate electrode to include metal or semiconductor-intermetallic compound, wherein said pair of electrodes and said channel portion have a Schottky junction.

8. The semiconductor device according to claim 7, wherein the first semiconductor film and the second semiconductor film are opposite to each other in a conductivity type.

9. The semiconductor device according to claim 7, wherein said semiconductor substrate comprises the channel portion provided on an insulation film or a semi-insulation semiconductor film.

10. The semiconductor device according to claim 7, wherein each of said pair of electrodes is provided by diffusing metal impurities.

11. The semiconductor device according to claim 7, wherein each of said pair of electrode films has a multitiered structure with different materials.

* * * * *

UNITED STATES PATENT AND TRADEMARK OFFICE
CERTIFICATE OF CORRECTION

PATENT NO. : 6,803,613 B2  Page 1 of 1
APPLICATION NO. : 10/096577
DATED : October 12, 2004
INVENTOR(S) : Keiji Ikeda et al.

It is certified that error appears in the above-identified patent and that said Letters Patent is hereby corrected as shown below:

In Column 10, after line 33; insert claims as described below;

--12. A semiconductor device of a hetero MOSFET structure, comprising:

a semiconductor hetero-junction, in which each semiconductor film of different band gap is joined to comprise a channel in each semiconductor film, respectively;

a gate electrode provided on the semiconductor heterojunction via a gate insulation film;

a pair of films including metal or semiconductor-intermetallic compound and having a Schottky junction between said channel, wherein operating with a selective carrier injection via a Schottky barrier generated between the semiconductor films in the semiconductor heterojunction, and with an addition of modulation to the Schottky barrier through an electric field effect from said gate electrode.

13. The semiconductor device according to claim 12, wherein said Schottky junctions are a source and a drain including metal or semiconductor-intermetallic compound suitable for the semiconductor film in the semiconductor hetero-junction.--

Signed and Sealed this

Ninth Day of June, 2009

JOHN DOLL
*Acting Director of the United States Patent and Trademark Office*